United States Patent [19]

Tailliet

[11] Patent Number: 5,548,134
[45] Date of Patent: Aug. 20, 1996

[54] DEVICE FOR THE PROTECTION OF AN INTEGRATED CIRCUIT AGAINST ELECTROSTATIC DISCHARGES

[75] Inventor: François Tailliet, Epinay sur Seine, France

[73] Assignee: SGS-Thomson Microelectronics, S.A., Gentilly Cedex, France

[21] Appl. No.: 53,606

[22] Filed: Apr. 27, 1993

[30] Foreign Application Priority Data

Apr. 30, 1992 [FR] France .................................. 92 05422

[51] Int. Cl.$^6$ .................................................. H01L 29/00
[52] U.S. Cl. .......................... 257/173; 257/546; 257/111; 257/362; 361/100
[58] Field of Search .................................... 257/111, 173, 257/162, 122, 355, 362, 546; 361/100

[56] References Cited

U.S. PATENT DOCUMENTS

| 4,890,187 | 12/1989 | Tailliet et al. . | |
|---|---|---|---|
| 4,939,616 | 7/1990 | Rountree | 361/56 |
| 5,003,371 | 3/1991 | Tailliet et al. . | |
| 5,012,317 | 4/1991 | Rountree | 257/173 |
| 5,016,078 | 5/1991 | Tailliet . | |
| 5,032,741 | 7/1991 | Zanders . | |
| 5,272,371 | 12/1993 | Bishop et al. . | |

FOREIGN PATENT DOCUMENTS

| 62-101067 | 5/1987 | Japan . |
|---|---|---|
| 2092826 | 8/1982 | United Kingdom . |
| 9014691 | 11/1990 | WIPO . |

OTHER PUBLICATIONS

U.S. Ser. No. 07/683245, Apr. 10, 1991.
U.S. Ser. No. 07/892941, Jun. 3, 1992.
U.S. Ser. No. 07/999527, Dec. 29, 1992.
Patent Abstracts of Japan, vol. 8, No. 161, Jul. 1984.
Patent Abstracts of Japan, vol. 15, No. 159, Apr. 22, 1991.
Patent Abstracts of Japan, vol. 11, No. 309, Oct. 8, 1987.

*Primary Examiner*—Jerome Jackson, Jr.
*Assistant Examiner*—Nathan K. Kelley
*Attorney, Agent, or Firm*—Robert Groover; Betty Formby

[57] ABSTRACT

In a device for the protection of integrated circuits against electrostatic discharges, the protection structure comprises a thyristor with an N+ region connected to the ground, a P– substrate, a deep N– well forming a gate region, and a P+ region connected to an external connection pad to be protected. The gate region is connected by a low-value resistor (with a maximum value of a few ohms) to the pad. This resistor increases the current for which the thyristor gets triggered and eliminates certain risks of the destruction of the circuit.

32 Claims, 7 Drawing Sheets

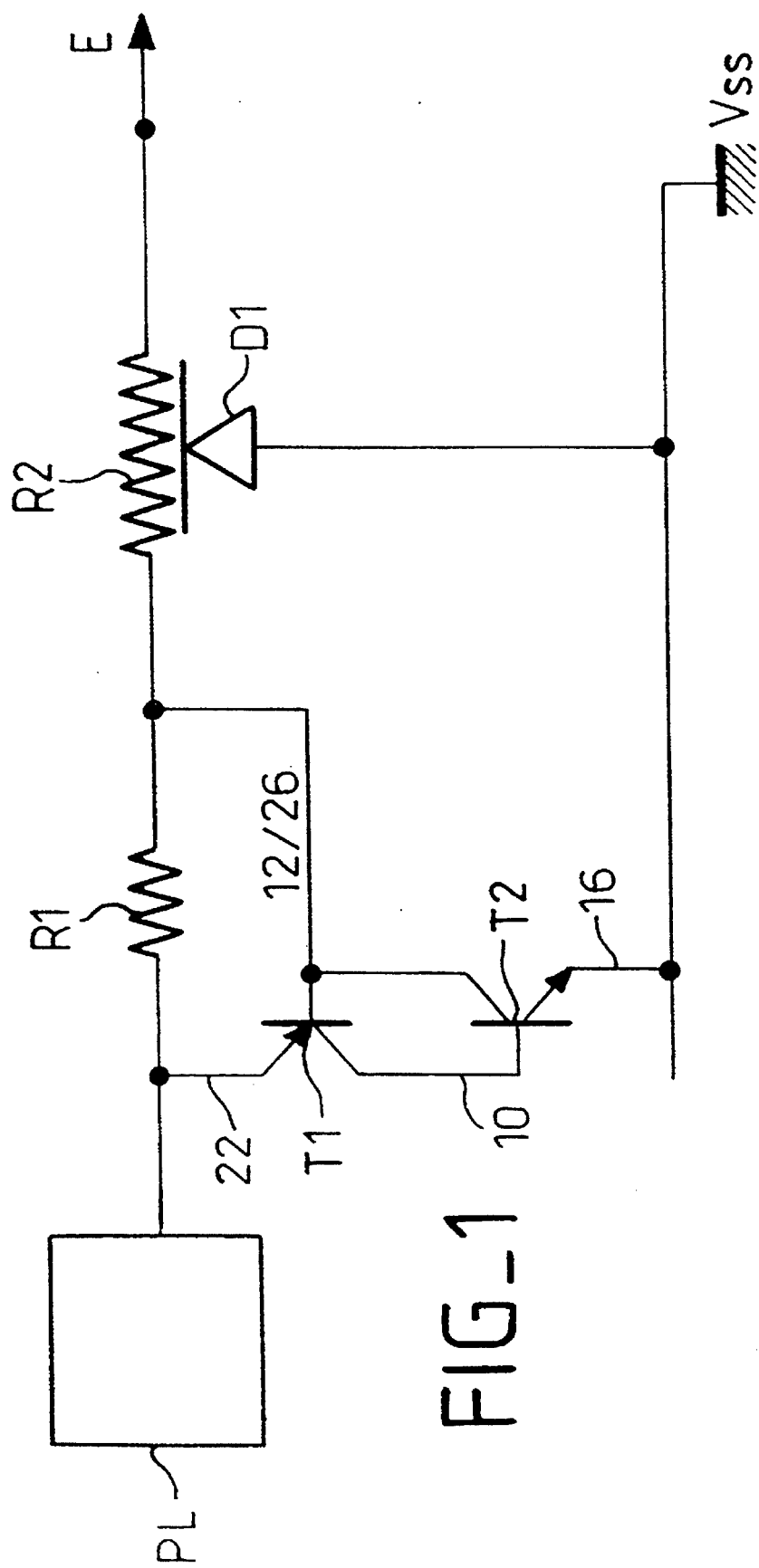
FIG_1

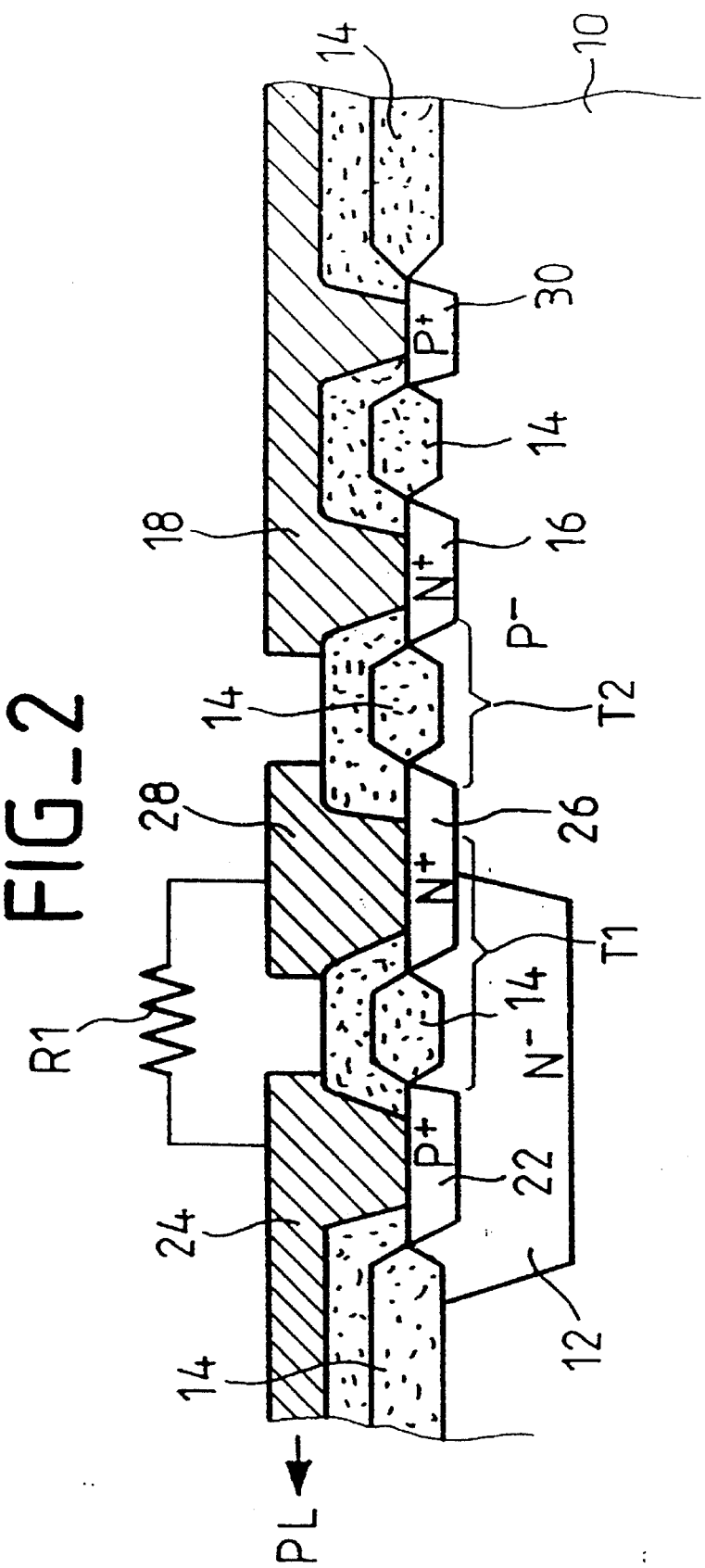

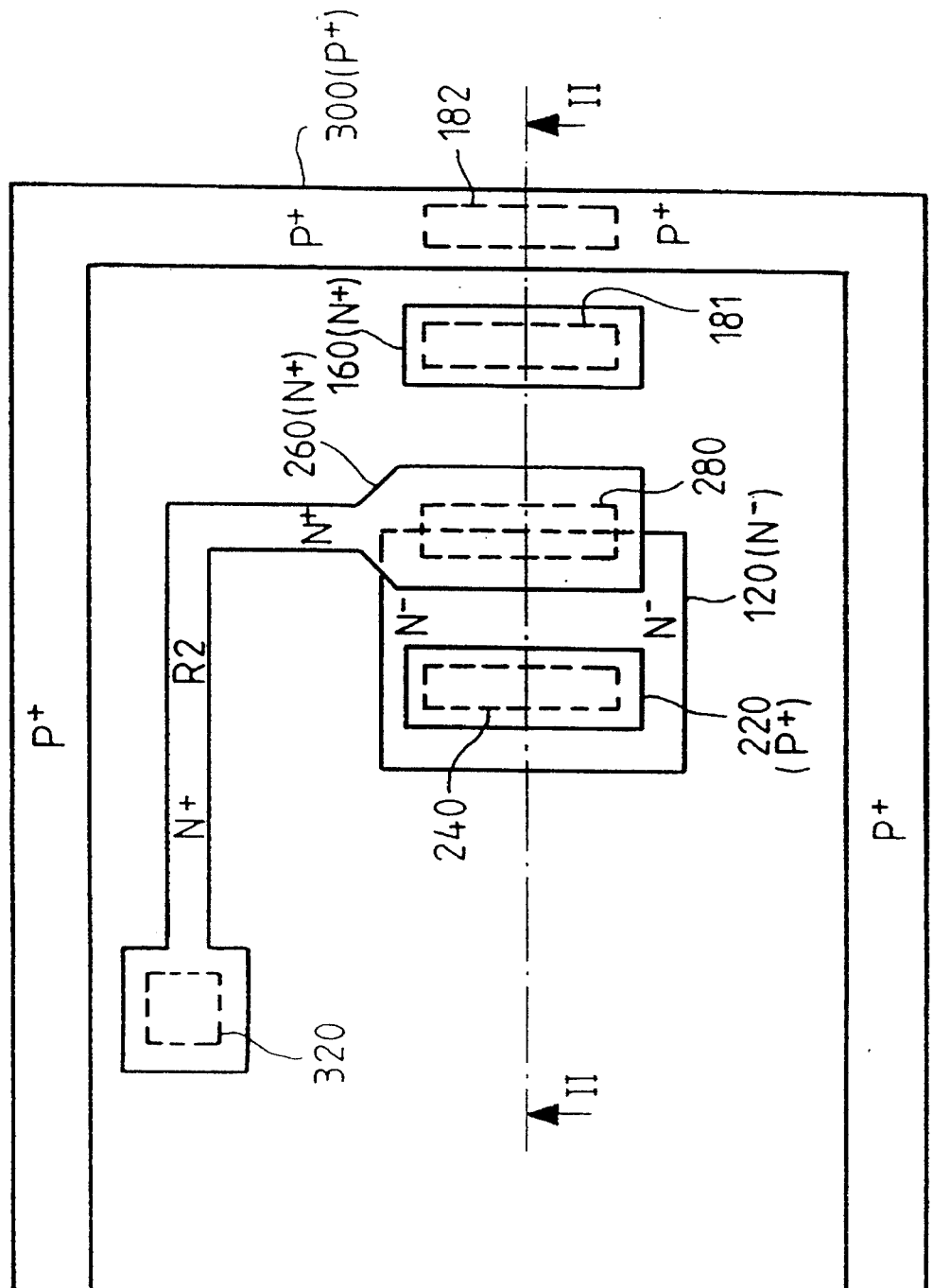
FIG_3

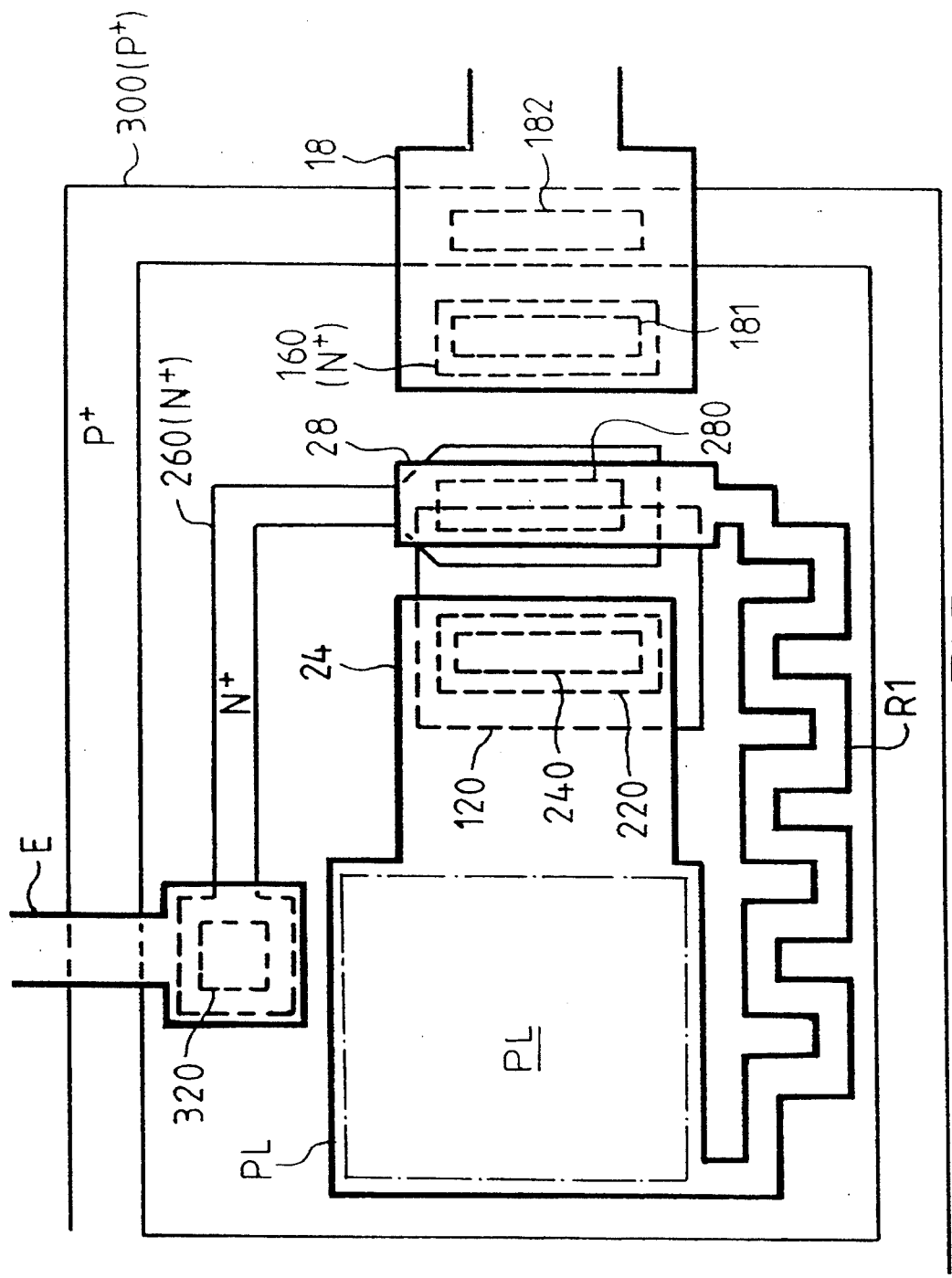
FIG_4

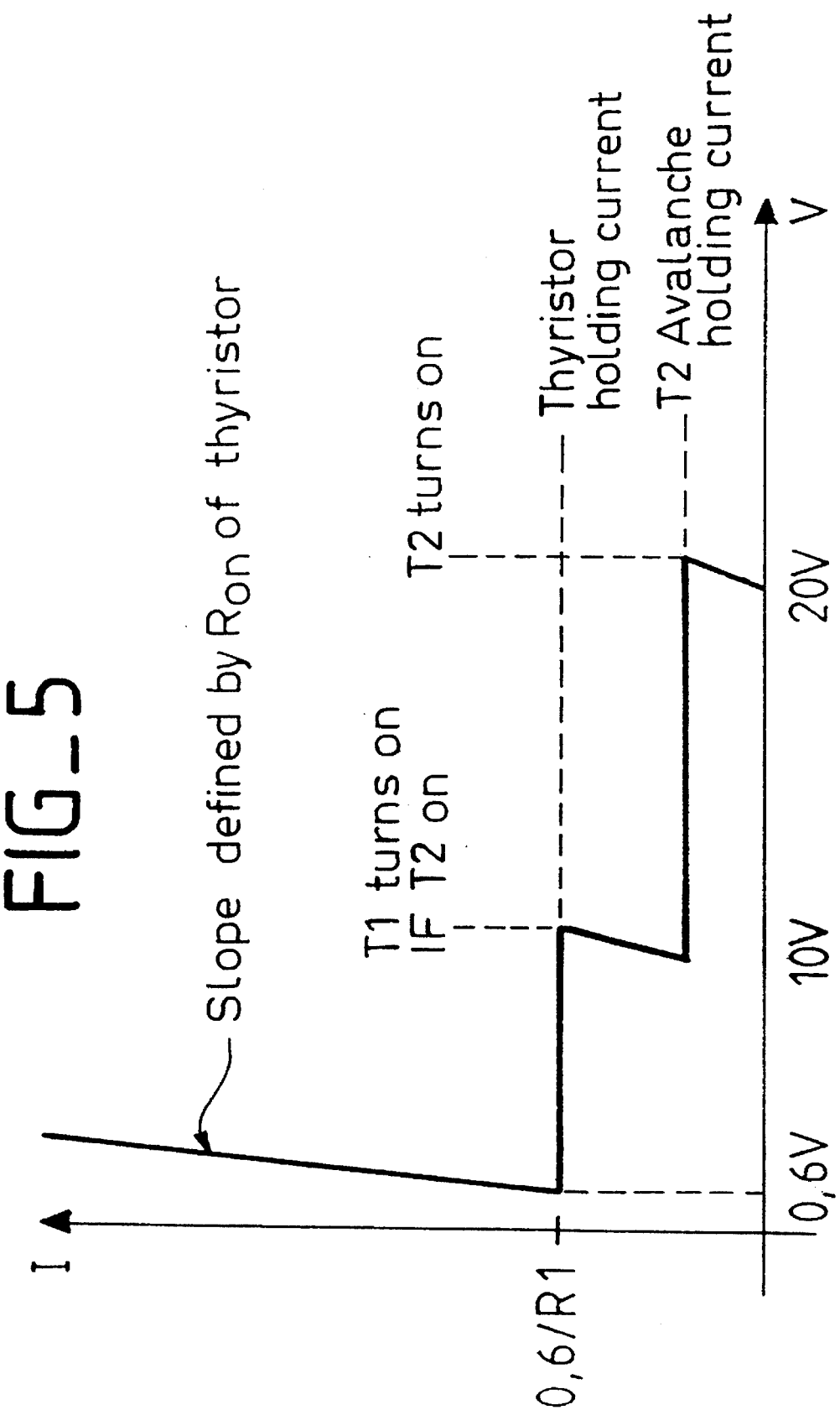
FIG_5

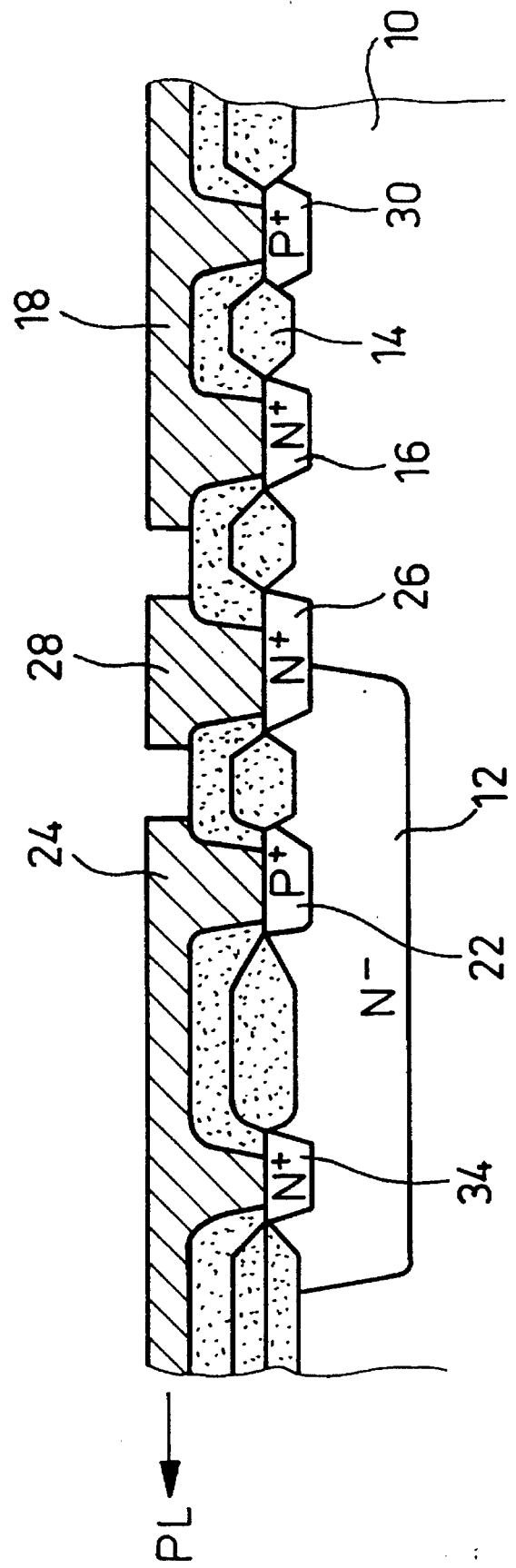
FIG_6

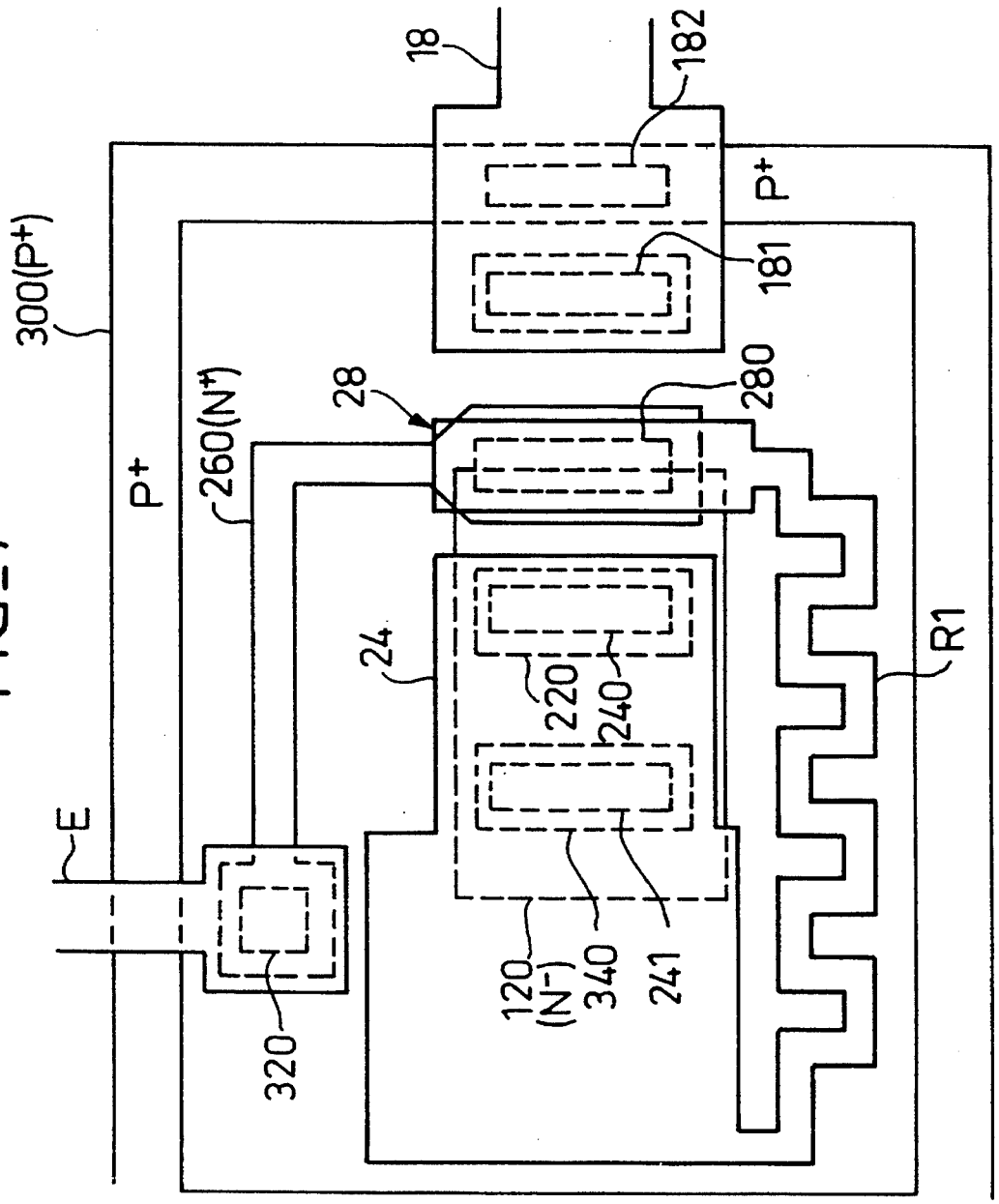

DEVICE FOR THE PROTECTION OF AN INTEGRATED CIRCUIT AGAINST ELECTROSTATIC DISCHARGES

CROSS-REFERENCE TO RELATED APPLICATION

This application claims priority from French App'n 92-054225, filed Apr. 30, 1992, which is hereby incorporated by reference.

BACKGROUND AND SUMMARY OF THE INVENTION

The invention relates to integrated circuits and, more specifically, it relates to devices for the protection of a circuit against over-voltages caused by electrostatic phenomena, that might appear at the external connection pads of the circuit.

Background: Electrostatic Discharges

A long-standing problem in microelectronics has been accidental destruction by electrostatic discharges (or similar externally generated voltage transients). This is particularly a problem in MOS[1] integrated circuits, where the inputs are normally connected to drive the gate of one or more MOS transistors, and a high voltage may break down the thin gate oxide. Once the gate oxide has thus been punctured, the transistor may be permanently damaged. Thus, it has long been conventional to use protection devices on the input pins of MOS integrated circuits. Such protection devices are designed to avalanche (passing a large amount of current, and dissipating the energy of the incoming transient) before the voltage on the input pin can reach levels which would damage the gate oxide.

[1] The term "MOS" is used in this application, as is now conventional, to refer to any insulated-gate-field-effect-transistor (IGFET), or to integrated circuits which include such transistors.

Over-voltages can arise notably through the handling of integrated circuit chips either during their manufacture or during their use, and these over-voltages go up to several tens of kilovolts. They are therefore liable to destroy the integrated circuit.

This is why provision is made for protection devices in the circuit, generally in the immediate vicinity of each connection pad, interposed between this pad and the circuit elements that could be damaged by the over-voltage.

Background: Protection Devices

The commonly encountered protection devices use chiefly resistors and diodes or transistors, firstly in order to limit the current likely to flow in the chip in the event of a discharge and, secondly, to clip the voltages likely to be transmitted to the circuit elements that are to be protected.

Resistors

One of the simplest protection strategies is to interpose a series resistor between the pad and the internal circuits, in combination with another element which limits the voltage to ground.[2] Thus, when a step-function increase in external voltage appears, the resistor will delay the appearance of this voltage on the internal circuits (so that the protection element will have time to turn on).

[2] See, e.g., U.S. Pat. No. 5,032,742 to Zanders, and published PCT Application WO 90/14691 of Avery et al., both of which are hereby incorporated by reference.

Bipolar Transistors

A standard protection device uses, for example, a lateral bipolar transistor interposed between a connection pad and the ground. In the usual case of a P−-type semiconductor substrate, the collector of the transistor is an N+ type surface diffusion connected to the pad; the emitter is another N+ type surface region diffused in the substrate and connected to the ground; the base is constituted by the substrate between the two N+ diffusions. The substrate is in principle also connected to the ground.

Should a major positive voltage appear on the pad (overvoltage measured with respect to the ground), the lateral bipolar transistor goes into avalanche mode (with an avalanche of the collector-base junction). The avalanche-triggering threshold is about 20 volts in the usual technologies. As soon as the avalanche is triggered, the transistor becomes highly conductive and dissipates the energy of the electrostatic discharge that has appeared at the pad. However, its internal resistance in the conductive state is not zero. In practice, a drop in voltage of at least about ten volts persists between the collector and the emitter, i.e. between the pad and the ground.

There is then a substantial output of heat owing to the high current which may flow through at a time when the residual voltage is also high. There is a risk of thermal destruction of the chip.

Thristors

It has also been proposed to use a thyristor rather than a transistor to fulfill the same function, for a thyristor has the advantage of a very low drop in residual voltage between its terminals once it has been made conductive.[3]

[3] See, e.g., U.S. Pat. No. 4,9039,616 to Rountre, and laid-open Japanese Application 59-61169 of Yasuda (Fujitsu), both of which are hereby incorporated by reference.

The drawback of a structure such as this is the risk of the untimely triggering of the thyristor and hence of its getting short-circuited in instances where this is not strictly necessary in view of the limited amount of energy to be dissipated. For these cases, one protection device per lateral transistor would be enough and the energy dissipated, even under ten volts, would not destroy the component. However, with a transistor, another risk arises: if it is assumed, for example, that the pad to be protected is a 5-volt supply pad, then this pad gets short-circuited with the ground as soon as the thyristor is triggered, destroying the current lead-in connection to this pad.

Innovative Protection Structures

According to the invention, it has been perceived that the drawbacks related to the use of a thyristor resulted above all from the fact that the thyristor tends to get triggered far too easily; it gets triggered even when the electrostatic discharge against which protection is required results only in relatively moderate currents.

A key innovative idea is to raise the triggering current by a substantial quantity. Thus it is possible to arrange matters in such a way, for example, that the triggering current has a value that approaches the limit current which would be acceptable from a thermal point of view with a voltage drop of about ten volts. The thyristor will not get triggered below this current.

The disclosed innovations accordingly provide an integrated circuit with at least one connection pad protected against over-voltages (notably electrostatic discharges) by a protection device which includes an integrated thyristor structure connected between the connection pad and ground, and a resistor (of very low value) connected in series between the bond pad and the internal circuits, and connected to set the voltage of the tyristor's gate. (That is, the thyristor comprises four successive, alternating PNPN semiconductor regions, including one end region of the alternation, and an intermediate region, known as a gate region, adjacent to the end region, these two regions being connected to the pad, with the low value resistor being interposed between the gate region and the pad.)

This low-value resistor (with a value of the order of a few ohms) has the role of increasing the value of the triggering current of the transistor with respect to the value that this triggering current would have if the gate region were to be floating. An example of this low-value series resistor is resistor R1 in the drawings.

Preferably, the value of the resistor is such that the triggering current of the thyristor is at least 100 milliamperes and, if possible, about 200 to 500 milliamperes or even 1 ampere. This implies a resistance of 1 ohm (for 600 milliamperes) to 6 ohms (for 100 milliamperes).

The resistor is preferably made of a thin-film metal layer deposited on the integrated circuit and etched with a shape and dimensions that correspond to the value of the resistance to be obtained. (Alternatively, a layer of polycrystalline silicon may be used.)

The low-value resistor is connected between the pad and the N– well. Thus, this resistor is connected in series between the input and the on-chip circuits. Series protection resistors have been previously proposed (as discussed above), but not with a function similar to the low-value resistor provided by the present invention. Note that, in the presently preferred embodiment, low-value resistor R1 is augmented by a separate series resistor R2.

A further consider is that it is difficult to make a low value resistor with a diffused layer in a conventional CMOS technology. As a matter of fact, such a resistor typically has a sheet resistance of 20 Ohms/□ or more. To get a 1 Ohm resistor using a 20 Ohms/□ diffusion, it would be necessary to design a 40/1 W/L ratio. Moreover, the contacts to the two sides of the resistors bounding leads to a few tenths of Ohms with square contact of 1 or 2 micrometers. Since the distance between two contacts may not be less than 2 micrometers, that would lead to a resistor width of 100 micrometer. The presence of such a large resistor at every bond pad would be inconvenient.

It is most preferable to implement this low-value resistor in metal (typically an aluminum alloy). An advantage of this is that an aluminum resistor has a positive temperature coefficient. Thus the resistance is weak when normally working, and higher when a discharge is present because a great energy is dissipated during this discharge. A weak resistor in normal working reduce the sensibility to latch up, while a high resistor provide for a good short circuit of the thyristor. However, although a metal resistor is preferable, other thin film layers of low sheet resistance (such as doped polysilicon or a silicide or a polycide) could be used instead.

The thyristor may be constituted as follows: a first N+ type region deposited superficially in a P—type substrate and in contact with a ground conductor of the circuit; a second region constituted by a P– substrate zone located between the first region and an N– well diffused in the substrate; a third region (gate region) constituted by the N– type well; a fourth P+ type region diffused superficially in the N– type well and in direct connection with the connection pad.

Preferably, a fifth N+ type diffused region is formed above the junction between the N– well and the substrate, this region acting as an ohmic contact between the N– well and the resistor. This fifth region also extends preferably out of the well, on the surface of the P– substrate; at its end located outside the well, it is connected to an input proper of the integrated circuit. In the well, this fifth region acts as a contact with the gate region, and it is this fifth region that is connected to the low-value resistor.

BRIEF DESCRIPTION OF THE DRAWING

The present invention will be described with reference to the accompanying drawings, which show important sample embodiments of the invention and which are incorporated in the specification hereof by reference, wherein:

FIG. 1 shows an equivalent diagram of a protection circuit according to the invention;

FIG. 2 shows a view, in a lateral section along the line II—II of FIG. 3 of the protection structure according to a first preferred embodiment of the invention;

FIG. 3 represents a top view of the protection structure according to the first embodiment, showing the different diffused zones but not the metallizations;

FIG. 4 shows a top view of the metallizations covering the protection structure;

FIG. 5 shows a current/voltage curve which schematically represents the behavior of the protection structure;

FIG. 6 shows a side view of a second embodiment of the invention;

FIG. 7 shows a top view of the second embodiment.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In FIG. 1, the reference PL designates an external connection pad of an integrated circuit chip. This pad should be protected against over-voltages arising out of electrostatic causes. This pad acts as an access terminal to transmit a current or a voltage between the exterior of the chip and the internal circuits (not shown) of the chip. In FIG. 1, the node E represents a point of internal circuitry thus connected to the access pad PL. The intermediate circuit elements between the pad PL and the node E form part of the protection circuit according to the invention.

An important element of this protection circuit is a thyristor placed between the pad and an electrical ground Vss of the integrated circuit. The thyristor is a succession of four semiconductor regions having alternating (PNPN) types of conductivity, represented in a standard way by a PNP transistor T1 imbricated with an NPN transistor T2, the base of each transistor being connected to the collector of the other.

The emitter of the NPN transistor constitutes a first end terminal of the thyristor and is connected to the ground Vss. The emitter of the PNP transistor constitutes a second end terminal of the transistor and is connected to the pad PL. The base of the PNP transistor, i.e. also the collector of the NPN transistor, constitutes the gate region of the thyristor.

The gate region is herein connected to the pad PL, not directly but through a low-value resistor R1. It is also connected to the input E of the on-chip circuit by a resistor R2. As shall be seen, this resistor R2 is in practice made in the form of an N+ diffusion in a P type substrate which, at the same time, constitutes an elongated NP junction extending throughout the length of the resistor. This is why FIG. 1 shows a diode D1 between the resistor R2 and the ground, this diode being distributed throughout the resistor.

The practical embodiment of this protection structure can be made as shown in FIG. 2 and FIG. 3. FIG. 3 shows a top view of the diffused regions, without the metallizations; FIG. 2 shows a cross-section along the line II—II of FIG. 3. FIG. 2 is drawn to an enlarged scale as compared with FIG. 3.

The substrate of the integrated circuit chip is preferably an epitaxial layer 10 of P− type silicon. However, this is not necessary. Indeed, most CMOS circuits have no epitaxial layer, because of cost among other reasons. In this substrate, there is diffused a deep N− well 12. Surface diffusions of P+ type and N+ type impurities, which are shallower and more heavily doped than the substrate and the well, are formed on the surface of the chip, both in the well and in the substrate and even possibly straddling the boundary between the well and the substrate. These surface diffusions are separated from one another by insulating regions 14, formed in principle by deep thermal oxidation of the silicon. Typical depths for the N+ and P+ surface diffusions would be 0.2 to 0.4 μm; typical depths for the N-well would be 2 to 4 μm.

The thyristor comprises the following successive regions: a first region 16 constituted by a surface zone with N+ type doping in the P− substrate, this zone being distant from the well 12. This first region is in direct contact with a conductor 18 which is a metallization (generally aluminum) connected to the ground Vss.

A second region of the thyristor is a surface zone of the P− substrate (i.e. one that is not otherwise doped) located between the N+ region 16 and the well 12.

The third region of the thyristor is the N− well 12. It is the gate region.

The fourth region is a P+ type surface zone 22 diffused in the well 12. It is in direct contact with a conductor 24 which is an (aluminum) metallization that is directly connected to the pad PL not shown in FIG. 2.

The resistor R2 of FIG. 1 is preferably constituted by a surface diffusion 26 with N+ type doping comprising one part in the well 12 as well as one part in the substrate 10 outside the well. FIG. 2 shows this band at a place where it overlaps the border of the well. In a sample embodiment, resistor R2 would have a typical value of 2KΩ. (However, this value could be reduced to achieve greater speed.)

The part of the band 26 that is in the well is used as an ohmic contact providing access to the well. This part constitutes a first end of the resistor R1 of FIG. 1. It is the end that is connected to the gate, i.e. to the base of the PNP transistor T1. The other end of the resistor R1 is the conductor 24 connected to the pad PL. Between the two, in FIG. 2, the resistor R1 has been shown only in symbolic form.

Note that resistor R1 is preferably a metallic resistor, formed, e.g., in the same metallization level as the pad PL, the conductor 24 and the conductor 18. The end 28 of this metallization in contact with the N+ region 26 can be seen in FIG. 2.

The resistor R1 may also be formed by a level of metallization different from the level of the pad PL of that of the other conductors. It may also be formed by an etched layer of polycrystalline silicon in contact, by one side, with the conductor 24 and, by the other side, with the region 26.

To end the description of FIG. 2, it should furthermore be mentioned that the ground conductor at Vss (metallization 18) is preferably in direct contact with the substrate by means of a P+ type doped zone 30 superficially diffused in the substrate. The N+ region 16 is located between the well and the P+ zone 30.

In FIG. 3, the reference 120 designates the outline of the N− well; 160 designates the outline of the N+ region 16; 220 designates the outline of the P+ region 22; 260 designates the outline of the region N+ 26 both outside and inside the well 12; 300 designates the outline of the P+ region 30.

The locations of the contacts between a metallization and a diffused region are represented by rectangles of dashes; they are the contacts: 181 between the ground metallization 18 and the N+ region 16; 182 between the metallization 18 and the P+ region 30; 240 between the metallization 24 and the P+ region 22; 280 between the metallization 28 and the N+ region 26; 320 between an input conductor E of the integrated circuit and the end of the resistor R2 (region 260) at the greatest distance from the well 12.

The same elements as in FIG. 3 have been drawn again in FIG. 4 with, in addition, bold lines marking the outlines of the different metallizations, in a preferred embodiment where the resistor R1 is a resistor formed by a metallization at the same level as the other metallizations of the diagram.

The different conductors that can be seen in FIG. 4 are: the ground conductor 18 in contact on the locations 181 and 182 with the regions 16 and 30 respectively; the input conductor E of the integrated circuit, in contact with the region 26 on the location 320; the access pad PL, a central region of which may receive a soldered wire (not shown); the conductor 24 which extends the pad PL and comes into contact with the P+ region 22 on the location 240; the conductor 28 in contact, on the location 280, with the end of the region 26 located on the top of the well 12; and finally the conductor (preferably narrow and elongated) constituting the resistor R1, one end of which is connected to the pad PL and the other to the conductor 28. (In the presently preferred embodiment, an additional guard ring, connected to VCC, surrounds the P+guard ring 30 which is illustrated. For clarity, this additional guard ring is not shown in the drawing.)

The working of this structure may be described schematically on the basis of the current/voltage curve shown in FIG. 5. This curve presents the current absorbed in the pad as a function of the voltage between the pad and the ground.

When the voltage rises above about twenty volts, the collector-base junction of the NPN transistor T2 (FIG. 1) goes into avalanche mode, the NPN transistor starts conducting a current, and the voltage between collector and emitter falls to about ten volts; the current rises. If the current delivery capacity of the source of electrostatic discharge is limited, the situation remains thus until the end of the discharge; only the NPN transistor participates in the removal of the discharge. However, if the current delivery capacity of the source of discharge is higher and reaches a value such that the drop in voltage in the resistor R1 exceeds about 0.6 volts, the PNP transistor comes on and the conduction of the thyristor is triggered. The thyristor then goes into quasi-short-circuit mode with a residual voltage that hardly exceeds 0.7 volts at its terminals.

It will be understood, therefore, that the triggering of the thyristor will occur only if the current of the discharge source reaches a value of several tens of milliamperes, once a resistance of some ohms is present between the pad and the gate. If not, the protection will be achieved only by the NPN transistor and the residual voltage at the terminals remains at a level of about ten volts, thus preventing the short-circuiting, for example, of a source of voltage applied to the pad.

The value that must be given to the resistor R1 is deduced from the previous one, as a function of the current that is tolerated in the NPN transistor when it has about ten volts at its terminals. If the maximum current accepted is I in amperes, the resistor R1 should have a value substantially equal to 0.6/I ohms. Acceptable values for I will generally range from 100 milliamperes to one ampere, leading to values of resistance of 6 ohms to 0.6 ohms approximately. These are therefore low-value resistors.

It is possible to provide for modifications to the structure thus described such as, for example, the addition of a diode directly between the pad PL and the ground conductor, to avoid damage to the resistor R1 in the event of negative discharges with high current.

Indeed, in the event of negative discharge on the pad, the current tends to go through the ground conductor 18, the P– substrate, the N– well, the N+ region 26, the conductor 28, the resistor R1 and the pad PL. If this current is excessively high, the resistor R1 is damaged. There is provision, therefore, for a direct link between the pad PL and the well 12, with N+ type ohmic contact, which short-circuits the resistor R1 in this case.

To make this direct link, an additional diffused N+ region 34 is formed in the well 12. It is placed at a distance from the P+ region 22 sufficient for it to avoid hampering the operation of the thyristor in the event of positive discharge. It is located beneath the conductor 24 or beneath the pad PL and is in contact with either one of them.

FIGS. 6 and 7 respectively show a sectional view and a top view of the structure corresponding to this modification. The outline of the additional diffusion 34 is designated by 340 and the location of the contact with the conductor 24 is designated by 241. In this embodiment, the diode D1 is still advantageous, since its distributed parasitic capacitance, in combination with the resistor R1, provides a reduced propagation speed for sharp voltage transitions caused by ESD events.

The entire structure according to the invention has been described with reference to an integrated circuit on a P– substrate with an N– well. It goes without saying that an equivalent structure can be formed by reversing all the types of conductivity. Only the structure on a P– substrate has been described, so as not to unnecessarily burden the description and the claims.

According to the present invention, the value of R1 is normally specified at about 1 Ohm. Greater values lead to too weak currents, and result in latch up risk in normal working.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, resistor R2 does not have to be linear. Thus a wide variety of elements (including active elements) may be substituted in place of the diffusion used to implement R2 in the presently preferred embodiment.

For another example, it is of course possible to use different or additional guard rings in combination with the P+ guard ring 30 which is illustrated.

For another example, in a double-level-metal process, the highest level of metal would be used for contact pads, and therefore would preferably also be used for resistor R1.)

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a plurality of internal elements configured to provide a substantially predetermined electronic functionality; and a plurality of externally connectable contact pads;
   at least a respective one of said pads being operatively connected to a respective node of said internal elements through a protection structure which includes
   a thyristor comprising
      a first semiconductor region of a first conductivity type,
      a second semiconductor region of a second conductivity type and abutting said first region,
      a third semiconductor region of said first conductivity type and abutting said second region, and
      a fourth semiconductor region of said second conductivity type and abutting said third region;
      wherein said second region separates said first region from said third region, and said third region separates said second region from said fourth region;
      said first semiconductor region of said thyristor being operatively connected to ground,
      said third semiconductor region of said thyristor being operatively connected to a respective one of said nodes, and
      said fourth semiconductor region of said thyristor being operatively connected to said respective contact pad; and
   a thin-film first resistor which has a value of less than about 10 ohms and more than about 0.6 ohms, and which is electrically interposed between said respective pad and said respective node of said internal elements.

2. The integrated circuit of claim 1, said internal elements comprising both N-channel and P-channel field-effect transistors; and Wherein said first region of said thyristor is provided by shallow heavily-doped N-type diffusions which are formed simultaneously with source/drain regions of said N-channel transistors; and wherein said fourth region of said thyristor is provided by a shallow heavily-doped P-type diffusion which is formed simultaneously with source/drain regions of said P-channel transistors.

3. The integrated circuit of claim 1, further comprising a guard ring of said second conductivity type which laterally surrounds said thyristor.

4. The integrated circuit of claim 1, said internal elements comprising both N-channel and P-channel field-effect transistors;
   and wherein said first and fourth regions of said thyristor are provided by shallow heavily-doped N-type and P-type diffusions which are respectively formed simultaneously with source/drain regions of said N-channel and P-channel transistors;
   and wherein at least some portions of said second and third regions of said thyristor are provided by P-type and N-type diffusions which are respectively formed simultaneously with body regions of said N-channel and P-channel transistors.

5. The integrated circuit of claim 1, further comprising a second resistor which is interposed between said third region of said thyristor and said respective node, is provided by a shallow diffusion having the same conductivity type as said third region of said thyristor, and is totally surrounded by respective guard ring.

6. An integrated circuit, comprising:
   a plurality of internal elements configured to provide a substantially predetermined electronic functionality; and a plurality of externally connectable contact pads; at least a respective one of said pads being operatively connected to a respective node of said internal elements through a protection structure which includes
   a thyristor comprising
      a first semiconductor region of a first conductivity type,
      a second semiconductor region of a second conductivity type and abutting said first region,
      a third semiconductor region of said first conductivity type and abutting said second region, and
      a fourth semiconductor region of said second conductivity type and abutting said third region;
      wherein said second region separates said first region from said third region, and said third region separates said second region from said fourth region;
      said first semiconductor region of said thyristor being operatively connected to ground,
      said third semiconductor region of said thyristor being operatively connected to one or more internal elements of said integrated circuit, and
      said third semiconductor region of said thyristor being operatively connected to a respective one of said nodes, and
      said fourth semiconductor region of said thyristor being operatively connected to said respective contact pad; and
   a thin-film first resistor which has a value of less than about 10 ohms and more than about 0.6 ohms, and which is electrically interposed between said respective pad and said third region of said thyristor; and
   a second resistor interposed between said third region of said thyristor and said respective node; said second resistor having a value which is more than one hundred times as high as that of said first resistor.

7. The integrated circuit of claim 6, said internal elements comprising both N-channel and P-channel field-effect transistors; and wherein said first region of said thyristor is provided by shallow heavily-doped N-type diffusions which are formed simultaneously with source/drain regions of said N-channel transistors; and wherein said fourth region of said thyristor is provided by a shallow heavily-doped P-type diffusion which is formed simultaneously with source/drain regions of said P-channel transistors.

8. The integrated circuit of claim 6, further comprising a guard ring of said second conductivity type which laterally surrounds said thyristor.

9. The integrated circuit of claim 7, said internal elements comprising both N-channel and P-channel field-effect transistors;
   and wherein said first and fourth regions of said thyristor are provided by shallow heavily-doped N-type and P-type diffusions which are respectively formed simultaneously with source/drain regions of said N-channel and P-channel transistors;

and wherein at least some portions of said second and third regions of said thyristor are provided by P-type and N-type diffusions which are respectively formed simultaneously with body regions of said N-channel and P-channel transistors.

10. The integrated circuit of claim 6, wherein said second resistor is provided by a shallow diffusion having the same conductivity type as said third region of said thyristor, and is totally surrounded by a respective guard ring.

11. The integrated circuit of claim 6, further comprising a junction diode having a respective P-type region thereof directly connected to said respective contact pad, and a respective N-type region thereof connected to ground potential.

12. An integrated circuit, comprising:
   a plurality of internal elements configured to provide a substantially predetermined electronic functionality; and a plurality of externally connectable contact pads; at least a respective one of said pads being operatively connected to a respective node of said internal elements through a protection structure which includes
   a thyristor comprising
      a first semiconductor region of a first conductivity type,
      a second semiconductor region of a second conductivity type and abutting said first region,
      a third semiconductor region of said first conductivity type and abutting said second region, and
      a fourth semiconductor region of said second conductivity type and abutting said third region;
      wherein said second region separates said first region from said third region, and said third region separates said second region from said fourth region;
      said first semiconductor region of said thyristor being operatively connected to ground,
      said third semiconductor region of said thyristor being operatively connected to a respective one of said nodes, and
      said fourth semiconductor region of said thyristor being operatively connected to said respective contact pad;
   a thin-film first resistor which has a value of less than about 10 ohms and more than about 0.6 ohms, and which is electrically interposed between said respective pad and said respective node of said internal elements; and a diode which has a first-conductivity type region directly connected to said respective pad, and a second conductivity-type region directly connected to ground.

13. The integrated circuit of claim 12, said internal elements comprising both N-channel and P-channel field-effect transistors; and wherein said first region of said thyristor is provided by shallow heavily-doped N-type diffusions which are formed simultaneously with source/drain regions of said N-channel transistors; and wherein said fourth region of said thyristor is provided by a shallow heavily-doped P-type diffusion which is formed simultaneously with source/drain regions of said P-channel transistors.

14. The integrated circuit of claim 12, further comprising a guard ring of said second conductivity type which laterally surrounds said thyristor.

15. The integrated circuit of claim 12, said internal elements comprising both N-channel and P-channel field-effect transistors;
   and wherein said first and fourth regions of said thyristor are provided by shallow heavily-doped N-type and P-type diffusions which are respectively formed simultaneously with source/drain regions of said N-channel and P-channel transistors;

and wherein at least some portions of said second and third regions of said thyristor are provided by P-type and N-type diffusions which are respectively formed simultaneously with body regions of said N-channel and P-channel transistors.

16. The intergrated circuit of claim 12, further comprising a second resistor which is interposed between said third region of said thyristor and said respective node, is provided by a shallow diffusion having the same conductivity type as said third region of said thyristor, and is totally surrounded by a respective guard ring.

17. An integrated circuit, comprising:

a plurality of externally connectable contact pads, and a plurality of internal elements configured to provide a substantially predetermined electronic functionality and containing plural respective input/output nodes each corresponding to one of said pads;

respective ones of said contact pads being formed in an island of thin-film metallization which is extended to form a first resistor having a value between about 0.6 ohms and 6 ohms inclusive;

each said respective pad being connected to said respective input/output node through the series combination of said first resistor and a diffused second resistor;

each said respective pad also being connected to ground through a thyristor, said first resistor being connected to a gate terminal of said thyristor.

18. The integrated circuit of claim 17, said internal elements comprising both N-channel and P-channel field-effect transistors;

and wherein said first region of said thyristor is provided by shallow heavily-doped N-type diffusions which are formed simultaneously with source/drain regions of said N-channel transistors; and wherein said fourth region of said thyristor is provided by a shallow heavily-doped P-type diffusion which is formed simultaneously with source/drain regions of said P-channel transistors.

19. The integrated circuit of claim 17, further comprising a guard ring of said second conductivity type which laterally surrounds said thyristor.

20. The integrated circuit of claim 17, said internal elements comprising both N-channel and P-channel field-effect transistors;

and wherein said first and fourth regions of said thyristor are provided by shallow heavily-doped N-type and P-type diffusions which are respectively formed simultaneously with source/drain regions of said N-channel and P-channel transistors;

and wherein at least some portions of said second and third regions of said thyristor are provided by P-type and N-type diffusions which are respectively formed simultaneously with body regions of said N-channel and P-channel transistors.

21. The integrated circuit of claim 17, wherein said second resistor is provided by a shallow diffusion having the same conductivity type as said third region of said thyristor, and is totally surrounded by a respective guard ring.

22. The integrated circuit of claim 17, further comprising a junction diode having a respective P-type region thereof directly connected to each said respective contact pad, and a respective N-type region thereof connected to ground potential.

23. An integrated circuit comprising at least one external connection pad and a protection device against the over-voltages likely to appear on this pad, notably owing to electrostatic discharges, wherein said protection device comprises a thyristor integrated structure connected between said pad and an electrical ground of the circuit, this thyristor including four semiconductor region of types P, N, P, and N, successively, among which an end region of the alteration and a gate region adjacent to the end region are connected to said pad, with a low-value resistor interposed between the gate region and said pad, said low-value resistor also being electrically interposed between said pad and internal elements of the integrated circuit, and having a value of about 0.6 to 6 ohms.

24. An integrated circuit according to claim 23, wherein the resistor has a value such that the current for triggering the conduction of the thyristor is about 100 milliamperes to one ampere.

25. An integrated circuit according to claim 23, wherein the resistor consists essentially of a thin film layer having substantially metallic conductivity.

26. An integrated circuit comprising a P− type semiconductor substrate arid at least one connection pad and a device to protect this pad against the over-voltages likely to appear on this pad, wherein the protection device comprises:

a surface region with N+ type doping, formed in the substrate and in contact with a ground conductor of the circuit, said surface region constituting a first region of a succession of four regions of alternating types of conductivity forming a thyristor;

an N− type well diffused in the substrate and separated from the first region by a P− type substrate zone, said zone constituting a second region of the thyristor and the well constituting a third region known as a gate region;

a P+ type region formed superficially in the well, said region constituting the fourth region of the thyristor, in direct electrical contact with said connection pad;

and a low-value resistor electrically interposed between said pad and the gate region, said low-value resistor also being interposed between said pad and internal elements of the integrated circuit, and having a value of about 0.6 to 6 ohms.

27. A circuit according to claim 26, comprising a fifth N+ type region, diffused superficially above the well, said region forming an ohmic contact for an electrical link between one end of the resistance and the N− well, the other end of the resistor being connected directly to said pad.

28. A circuit according to claim 27, wherein the fifth region extends both above the well and in the substrate outside the well, and wherein it is connected, at an end located outside the well, to an input conductor of the integrated circuit.

29. A circuit according to claim 28, wherein the resistor is constituted by a layer of metal or polycrystalline silicon in contact, at one end, with said pad and, at another end, with a part of the fifth region, located above the N− well.

30. A circuit according to claim 26, wherein a sixth N+ type sixth region is formed superficially in the well, at a distance from the fourth P+ type region, this region being in direct electrical contact with said pad.

31. A circuit according to claim 26, comprising a P+ type region formed superficially in the substrate and directly connected to the ground conductor.

32. A circuit according to claim 26, wherein the various surface regions with P+ type and N+ type doping are separated from one another by thick oxide zones.

* * * * *